United States Patent [19]

Woodberry

[11] Patent Number: 4,956,555
[45] Date of Patent: Sep. 11, 1990

[54] MULTICOLOR FOCAL PLANE ARRAYS

[75] Inventor: Frank J. Woodberry, Oxnard, Calif.

[73] Assignee: Rockwell International Corporation, Thousand Oaks, Calif.

[21] Appl. No.: 374,412

[22] Filed: Jun. 30, 1989

[51] Int. Cl.$^5$ .............................. G02B 5/20; G01J 3/36
[52] U.S. Cl. .................................. 250/339; 250/226; 250/578.1; 350/1.7; 350/404
[58] Field of Search ................ 250/332, 339, 226, 578; 350/166, 1.6, 1.7, 404, 397

[56] References Cited

U.S. PATENT DOCUMENTS

| | | | |
|---|---|---|---|
| 3,962,578 | 6/1976 | Roschen | 250/226 |
| 3,996,461 | 12/1976 | Sulzbach et al. | 250/211 J |
| 4,093,353 | 6/1978 | Lang | 350/313 |
| 4,158,133 | 6/1979 | Spaeth et al. | 250/211 J |
| 4,253,022 | 2/1981 | Allen et al. | 250/349 |
| 4,269,481 | 5/1981 | Yeh et al. | 350/356 |
| 4,373,782 | 2/1983 | Thelen | 350/166 |
| 4,522,862 | 6/1985 | Bayer et al. | 428/195 |
| 4,547,074 | 10/1985 | Hinoda et al. | 356/405 |
| 4,596,930 | 6/1986 | Steil et al. | 250/332 |
| 4,645,290 | 2/1987 | Walsh | 350/1.7 |
| 4,822,998 | 4/1989 | Yokota et al. | 250/226 |

OTHER PUBLICATIONS

Berning et al., "Induced Transmission in Absorbing Films Applied to Band Pass Filter Design", Journal of the Optical Society of America, vol. 47, pp. 230–239, 1957.
Turner, "Some Current Developments in Multilayer Optical Film", Journal de Physique et le Radium, vol. II pp. 443–460, 1950.

Primary Examiner—Constantine Hannaher
Assistant Examiner—Edward J. Glick
Attorney, Agent, or Firm—John J. Deinken

[57] ABSTRACT

A multicolor focal plane array, which detects and distinguishes between incoming electromagnetic radiation within first and second bands of wavelengths, includes a substrate and a two dimensional array of detectors disposed on the substrate and responsive to electromagnetic radiation within a predetermined range of wavelengths including the first and second wavelength bands. A first multilayer thin film filter is disposed on the substrate and interposed between the incoming radiation and a first subset of the detectors in the array, while a second multilayer thin film filter is disposed on the substrate and interposed between the incoming radiation and a second subset of the detectors in the array. The first and second filters include a dielectric/thin metal/dielectric layer combination, the filters differing only in that the thickness of the dielectric layers in the first filter combination are adjusted to select the first wavelength band, while the thicknesses of the dielectric layers in the second filter combination are adjusted to select the second wavelength band. In this manner, the detectors in the first subset are made sensitive to radiation within the first wavelength band, while the detectors in the second subset are sensitive to radiation within the second wavelength band.

1 Claim, 2 Drawing Sheets

MULTICOLOR FOCAL PLANE ARRAYS

BACKGROUND OF THE INVENTION

This invention is concerned with focal plane array technology for detecting incoming electromagnetic radiation with a two dimensional array of detectors.

Many advanced optical sensors require spectral selectivity as part of the function of target detection and discrimination. In the infrared region, for example, various methods have been proposed to provide multicolor infrared detection, some making use of a complex detector architecture, others using spectral filtering methods. Multiple apertures, or the use of dichroic beamsplitters with separate focal planes, are among the optical solutions which have been devised. Alternatively, segmented filters are placed in close proximity to the focal plane. This last approach has the disadvantages of complicating the optical and mechanical design, increasing the cooling requirements, and introducing the possibility of spectral crosstalk. Current technology requires that such filters be deposited onto separate substrates because most optical thin films must be deposited onto heated substrates at temperatures well above the safe limits for HgCdTe detectors, while filters deposited prior to detector formation must withstand the subsequent handling procedures. Filters on separate substrates incur several system penalties. The filter is a separate component which must be cryogenically cooled, placing increased demands on system cooling capacity. Furthermore, multicolor operation requires the use of a segmented focal plane with scanning capability to obtain accurate spatial as well as spectral information.

Spectral filter arrays are known in the art for visible wavelength applications. These filters consist of arrays of thin film interference filters, each color being determined by a totally independent filter design. This approach cannot be applied to an integrated multicolor filter because different color filters are made by changing the thickness of each of the separate coating layers in proportion to the ratio of the two wavelengths desired. A criterion for a suitable filter design for infrared applications is that the wavelength be selectable by modification of one or, at most, a small number of layers within the overall structure. Adhering to this constraint makes the fabrication of a patterned array more feasible because two completely independent filter designs do not need to be deposited.

As a consequence of these restrictions, current infrared focal plane array technology is limited to a single wavelength band of operation for each detector array or subarray. Multicolor focal planes require separate staring arrays with individual spectral filters or are built up of individual linear array components (usually several elements in width), each associated with a different bandpass filter. Other multicolor approaches require scanning of the scene over multiple linear arrays with individual filter elements.

An improved optical thin film technology which would integrate spectral bandpass filters with a focal plane array could have a major impact on future imaging and surveillance systems. New material and processing technology is needed to permit the deposition of spectral filters onto detector arrays at ambient temperatures and to fabricate filter arrays directly on the focal plane arrays so that different regions of the same array can respond to different wavelengths.

SUMMARY OF THE INVENTION

The multicolor focal plane array of this invention detects and distinguishes between incoming electromagnetic radiation within a first band of wavelengths and incoming electromagnetic radiation within a second band of wavelengths. The array includes a substrate and a two dimensional array of detectors disposed on the substrate and responsive to electromagnetic radiation within a predetermined range of wavelengths including the first and second wavelength bands. A first multilayer thin film filter is disposed on the substrate and interposed between the incoming radiation and a first subset of the detectors in the array to prevent radiation outside of the first wavelength band from reaching the detectors in the first subset. A second multilayer thin film filter is disposed on the substrate and interposed between the incoming radiation and a second subset of the detectors in the array to prevent radiation outside of the second wavelength band from reaching the detectors in the second subset. In this manner, the detectors in the first subset are made sensitive to radiation within the first wavelength band, while the detectors in the second subset are sensitive to radiation within the second wavelength band.

In a more particular embodiment, the first filter includes a first dielectric/thin metal/dielectric layer combination, the thicknesses of the dielectric layers in the first filter combination being adjusted to select the first wavelength band. The second filter includes a second dielectric/thin metal/dielectric layer combination, the thicknesses of the dielectric layers in the second filter combination being adjusted to select the second wavelength band.

DESCRIPTION OF THE INVENTION

It is an outstanding feature of this invention to provide a novel technique for integrating a solid state focal plane with a complex filter, thereby allowing the focal plane to discriminate between incoming radiation from two different wavelength bands within the response range of the detectors on the focal plane.

Some applications for a multicolor focal plane require the selection of two narrow bands within a broader band of wavelengths. A metal-dielectric interference filter, such as the induced-transmission filter of Turner (See, e.g., Berning, et al., Induced Transmission in Absorbing Films Applied to Band Pass Filter Design, Journal of the Optical Society of America, Volume 47, Pages 230–239 (1957); Turner, Some Current Developments in Multilayer Optical Films, Journal de Physique et le Radium, Volume 11, Pages 443–460 (1950); Yeh, et al., U.S. Pat. No. 4,269,481) has been shown to be capable of providing such bandpass tuning by varying the thickness of only two layers within the filter structure. Although this result can also be achieved with a conventional cavity type of interference filter, attempts to shift the passband by altering only one or two of the layers in the latter design will result in severe degradation of the filter at long wavelengths. With the induced-transmission approach, it has been demonstrated that the passband can be shifted by changing the thickness of the two cavity layers bordering the metal film with no out-of-band performance degradation.

Figure 1A:
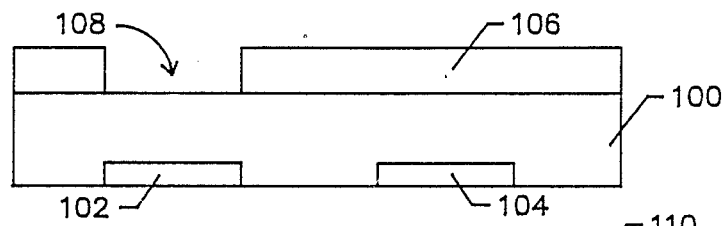
FIGS. 1a–1g are cross sectional side views illustrating the steps involved in fabricating a multicolor metal dielectric filter according to the present invention.

FIGS. 1a–1g are cross sectional side views illustrating the steps involved in fabricating a multicolor metal dielectric filter according to the present invention. In FIG. 1a, a substrate 100 is shown with two detectors 102 and 104 fabricated on the front side of the substrate. A first photoresist layer 106 is deposited on the back side of the substrate and cavities, such as the cavity 108, are opened up in the layer 106 over some of the detectors, such as the detector 102. As those skilled in the art will appreciate, an actual focal plane would contain a larger number of detectors in a two dimensional array, and some of the dimensions in the figures are exaggerated, both of these deviations being for the purposes of best illustrating the inventive features of the illustrated embodiment.

Figure 1B:
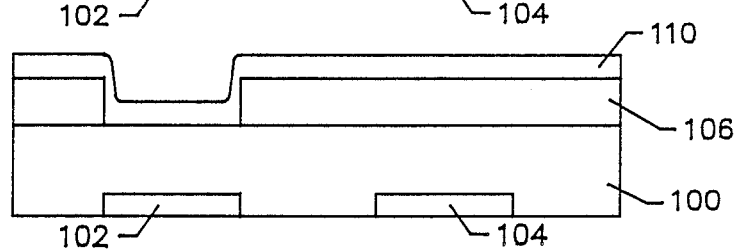
Figure 1C:
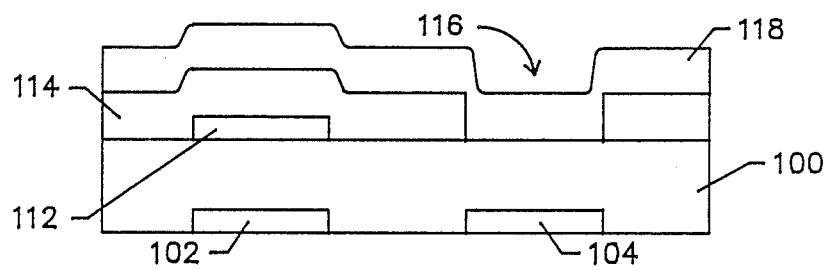

As shown in FIG. 1b, a first dielectric layer 110 is then deposited over the resist layer 106. The resist layer 106 is removed, as shown in FIG. 1c, leaving the first dielectric in selected regions, such as the region 112, over selected detectors. A second photoresist layer 114 is deposited and cavities, such as the cavity 116, are opened up over another subset of the detectors, including the detector 104. A second dielectric layer 118 is then deposited.

Figure 1D:
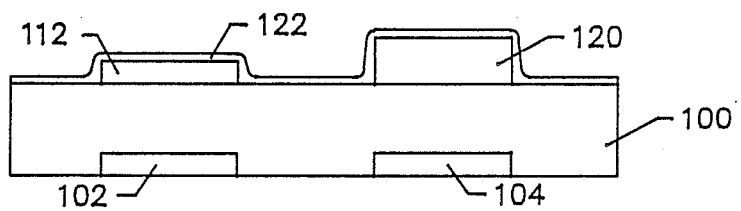

After the second resist layer 114 is removed, the second dielectric layer is left in selected regions, such as the region 120, over the second subset of detectors, as shown in FIG. 1d. An absorbing metal layer 122 is then deposited over the back side of the substrate.

Figure 1E:
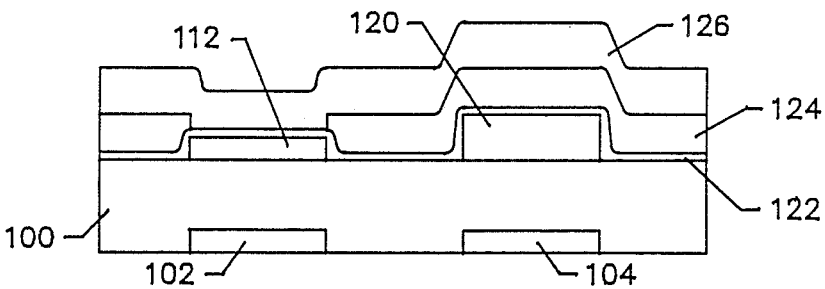
Figure 1F:
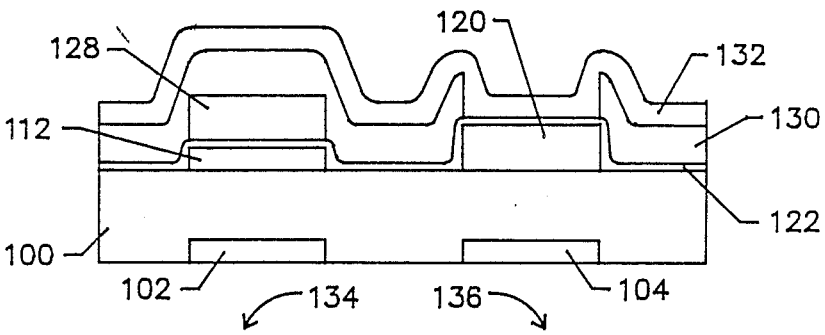
Figure 1G:
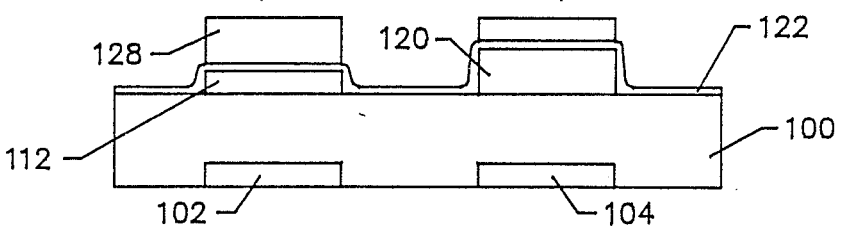

Next, as shown in FIG. 1e, a third photoresist layer 124 is deposited and opened up over the first selected subset of detectors, then a third dielectric layer 126 is deposited. The third resist layer is removed, leaving the third layer in regions, such as the region 128, over the first regions, as shown in FIG. 1f. A fourth photoresist layer 130 is deposited and opened up over the second subset of detectors, then a fourth dielectric layer 132 is deposited. Finally, as shown in FIG. 1g, the fourth resist layer 130 is removed, leaving a first dielectric/metal/-dielectric cavity layer combination 134 over the first subset of detectors within the focal plane and a second dielectric/metal/dielectric cavity layer combination 136 over the second subset of detectors. As those skilled in the art will appreciate, in an actual filter design additional dielectric layers will be placed on either side of the dielectric/metal/dielectric layers shown in FIG. 1. These dielectric reflector stacks need not be illustrated, however, since they are conventional in the art, will be the same for both portions of the filter design, and will be much thicker than the dielectric/metal/dielectric cavity layers which are shown.

The absorbing metal layer 122 ordinarily blocks all wavelengths of light. The dielectric layers, however, arranged on both sides of this metal layer produce an electric field standing wave around the metal layer and place the metal layer in a null of the electric field at one particular wavelength, allowing light to be transmitted at that wavelength. By changing the thickness of the two layers adjacent to the metal layer, a different wavelength may be selected for transmission to each of the subsets of detectors within the focal plane. Table I lists the layer specifications for a first filter of this type which is designed to transmit at a wavelength of 3.5 microns, while Table II lists the layer specifications for a second filter which is identical to the first except for the thicknesses of the two dielectric layers closest to the metal layer, this change in only two layers causing the second filter to transmit at a wavelength of 4 microns.

TABLE I

| Layer Number | Thickness (microns) | Refractive Index | |
|---|---|---|---|
| | | n (real) | k (imaginary) |
| 1 | .3723 | 2.35 | 0 |
| 2 | .6481 | 1.35 | 0 |
| 3 | .3723 | 2.35 | 0 |
| 4 | .6481 | 1.35 | 0 |
| 5 | .3723 | 2.35 | 0 |
| 6 | 1.2747 | 1.35 | 0 |
| 7 (Metal) | .0124 | 2.00 | −35 |
| 8 | 1.2909 | 1.35 | 0 |
| 9 | .3723 | 2.35 | 0 |
| 10 | .6481 | 1.35 | 0 |
| 11 | .3723 | 2.35 | 0 |
| 12 | .6481 | 1.35 | 0 |
| 13 | .3723 | 2.35 | 0 |

TABLE II

| Layer Number | Thickness (microns) | Refractive Index | |
|---|---|---|---|
| | | n (real) | k (imaginary) |
| 1 | .3723 | 2.35 | 0 |
| 2 | .6481 | 1.35 | 0 |
| 3 | .3723 | 2.35 | 0 |
| 4 | .6481 | 1.35 | 0 |
| 5 | .3723 | 2.35 | 0 |
| 6 | .0968 | 1.35 | 0 |
| 7 (Metal) | .0124 | 2.00 | −35 |
| 8 | 3.0556 | 1.35 | 0 |
| 9 | .3723 | 2.35 | 0 |
| 10 | .6481 | 1.35 | 0 |
| 11 | .3723 | 2.35 | 0 |
| 12 | .6481 | 1.35 | 0 |
| 13 | .3723 | 2.35 | 0 |

Figure 2:
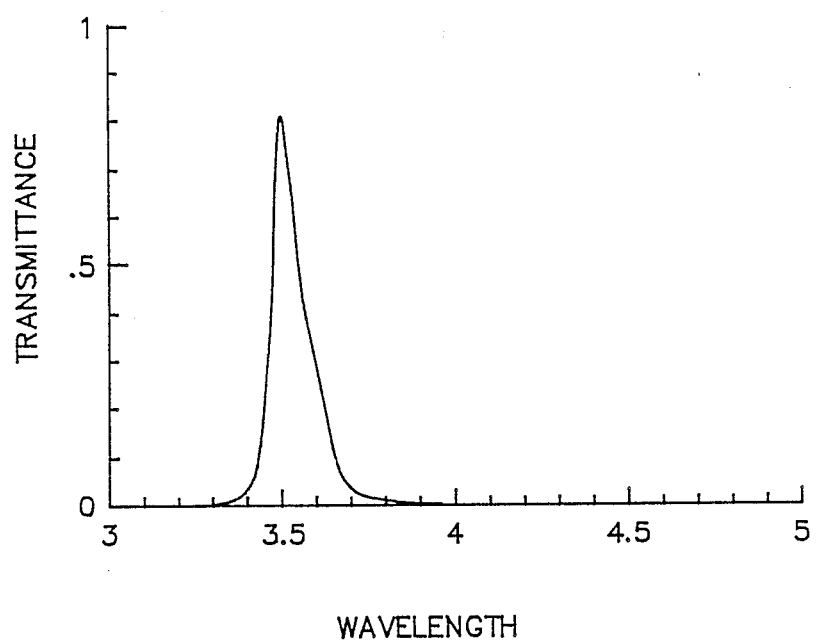
FIG. 2 is a plot of the calculated transmittance of the metal dielectric filter specified in Table I as a function of wavelength.
Figure 3:
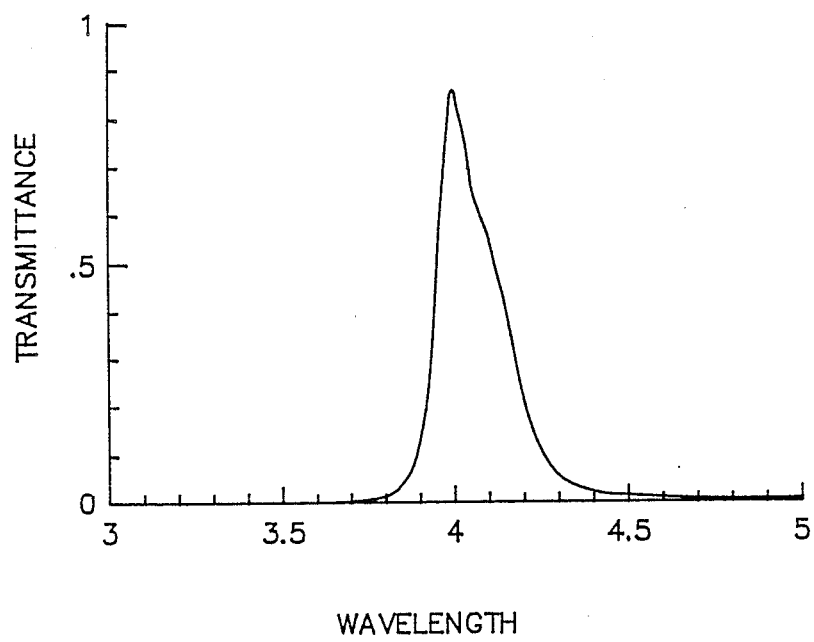
FIG. 3 is a plot similar to FIG. 2 showing the transmittance of the Table II filter design.

FIG. 2 is a plot of the calculated transmittance of the Table I filter as a function of wavelength, showing the narrow peak in the transmission profile at a wavelength of 3.5 microns. FIG. 3 is a similar plot showing the transmittance of the Table II filter design, with a peak at a wavelength of 4.0 microns. Those skilled in the art will appreciate that this approach can be readily expanded to achieve selectivity among more than two narrow bands.

The preferred embodiments of this invention have been illustrated and described above. Modifications and additional embodiments, however, will undoubtedly be apparent to those skilled in the art. Furthermore, equivalent elements may be substituted for those illustrated and described herein, parts or connections might be reversed or otherwise interchanged, and certain features of the invention may be utilized independently of other features. Consequently, the exemplary embodiments should be considered illustrative, rather than inclusive, while the appended claims are more indicative of the full scope of the invention.

The teaching of the following documents, which are referred to herein, is incorporated by reference:

Berning, et al., Induced Transmission in Absorbing Films Applied to Band Pass Filter Design, Journal of the Optical Society of America, Volume 47, Pages 230-239 (1957);

Turner, Some Current Developments in Multilayer Optical Films, Journal de Physique et le Radium, Volume 11, Pages 443-460 (1950);

Yeh, et al., U.S. Pat. No. 4,269,481.

I claim:

1. A multicolor focal plane array for detecting and distinguishing between incoming electromagnetic radiation within a first band of wavelengths and incoming electromagnetic radiation within a second band of wavelengths, comprising:

a substrate;

a two dimensional array of detectors disposed on the substrate and responsive to electromagnetic radiation within a predetermined range of wavelengths including the first and second wavelength bands;

a first multilayer thin film filter disposed on the substrate and interposed between the incoming radiation and a first subset of the detectors in the array to prevent radiation outside of the first wavelength band from reaching the detectors in the first subset, the first filter including a first dielectric/thin metal/dielectric layer combination, the thicknesses of the dielectric layers in the first filter combination being adjusted to select the first wavelength band; and a second multilayer thin film filter disposed on the substrate and interposed between the incoming radiation and a second subset of the detectors in the array to prevent radiation outside of the second wavelength band from reaching the detectors in the second subset, the second filter including a second dielectric/thin metal/dielectric layer combination, the thicknesses of the dielectric layers in the second filter combination being adjusted to select the second wavelength band, thereby rendering the detectors in the first subset sensitive to radiation within the first wavelength band and the detectors in the second subset sensitive to radiation within the second wavelength band, the first and second filters being substantially identical except for the thicknesses of two layers within each filter.

* * * * *